United States Patent [19]
Chia et al.

[11] Patent Number: 5,981,311
[45] Date of Patent: Nov. 9, 1999

[54] PROCESS FOR USING A REMOVEABLE PLATING BUS LAYER FOR HIGH DENSITY SUBSTRATES

[75] Inventors: Chok J. Chia, Cupertino; Seng Sooi Lim; Patrick Variot, both of San Jose, all of Calif.

[73] Assignee: LSI Logic Corporation, Milpitas, Calif.

[21] Appl. No.: 09/104,838

[22] Filed: Jun. 25, 1998

[51] Int. Cl.$^6$ ............................ H01L 21/58; H01L 21/48; H01L 21/28; H01L 21/304

[52] U.S. Cl. ........................ 438/106; 438/611; 438/612; 438/652; 438/667; 438/669; 438/675; 438/686; 438/687; 438/759; 438/780; 438/599; 438/121; 438/125

[58] Field of Search ..................... 438/106, 121, 438/125, 611, 599, 612, 652, 667, 669, 675, 686, 687, 759, 780, 928, 942, FOR 342, FOR 349, FOR 363, FOR 369, FOR 403, FOR 406

[56] References Cited

U.S. PATENT DOCUMENTS

| | | |
|---|---|---|
| 5,010,038 | 4/1991 | Fox et al. . |
| 5,346,861 | 9/1994 | Khandros et al. . |
| 5,407,864 | 4/1995 | Kim . |
| 5,646,067 | 7/1997 | Gaul . |
| 5,770,476 | 6/1998 | Stone . |

*Primary Examiner*—David E. Graybill

[57] ABSTRACT

A method of electroplating a high density integrated circuit (IC) substrate using a removable plating bus including the steps of providing an IC substrate made of nonconductive material having a plurality of conductive traces formed on its surface. Attaching a removable plating bus to the IC substrate, covering the plurality of conductive traces. Forming through holes (or vias) in predetermined locations. The holes going through the removable plating bus and IC substrate, exposing edges of selected conductive traces in the holes. Plating the through holes with a conductive material (such as copper) that electrically connects the removable plating bus to the exposed edges of the traces in the holes. Coating the IC substrate (including the removable plating bus) with plating resist and selectively removing portions of the removable plating bus, along with the plating resist, to expose selected areas of traces on the IC substrate that require plating. Electroplating the exposed trace areas on the IC substrate with conductive material (such as gold or nickel) by using the removable plating bus as the electrical connection to the exposed metal traces and removing the removable plating bus after electroplating is finished.

16 Claims, 2 Drawing Sheets

PROCESS FOR USING A REMOVEABLE PLATING BUS LAYER FOR HIGH DENSITY SUBSTRATES

BACKGROUND OF THE INVENTION

The present invention relates to plating integrated circuit packages, and more particularly to electroplating traces on an integrated circuit (IC) substrate using a removable plating bus.

In the last few decades, the electronics industry has literally transformed the world. Electronic devices are used by, or affect the daily lives of, a large segment of the world's population. For example, telephones, television, radios, Personal Computers (PCs), laptop PCs, palmtop PCs, PCs with built-in portable phones, cellular phones, wireless phones, pagers, modems, and video camcorders, are just a few of the electronic products that have been developed in recent years and which have been made smaller and more compact, while providing more and/or enhanced functions than ever before. The integrated circuit (IC) chip, and the more efficient packaging of the IC chip, have played a key role in the success of these devices.

Integrated circuit substrates are used to connect the IC chip to the electronic package. One popular group of packages is the Grid Array package, which consists of an IC substrate for mounting and interconnecting the IC chip to the electronic package. On the top surface of the IC substrate, an IC chip is mounted and electrically connected to traces that are formed on the top surface of the IC substrate. On the bottom surface of the IC substrate, pins or solder balls are mounted in an array pattern for connection of the electronic package.

The IC chip is typically attached in the center of the IC substrate. Wires are used to connect a plurality of contact pads on the IC chip to lands on the IC substrate. The lands are typically the ends of the traces near the IC chip. Alternatively, the IC chip can be connected directly to the lands by solder bumps (this is known as a flip-chip connection). The lands are in turn connected to the array of pins or balls on the opposite surface on the IC substrate by metal traces and vias through the IC substrate. The metal traces are typically made of copper.

For wire bonding or bump attachment of the IC chip, the lands should be plated with gold, nickel or silver. The preferred method of plating is electroplating. Electroplating is easily controlled, efficient and cost effective. During the electroplating process, conductive material is deposited in preselected areas. Electroplating requires that an electrically conductive connection be made to all the lands and metal traces that are to be plated. To prevent the conductive material from piling on undesired areas, the traces and IC substrate are covered so that the plating will not stick. This can be done with a plating resist material that is applied to the IC substrate. In certain areas where the plating material is desired, the resist material is removed. The plating solution bath and the exposed area on the conductive traces or lands function as a pair of electrodes. An electric current flows from an outside source through traces to deposit desired conductive material on the selected areas of the IC substrate.

To electrically connect the lands and traces together, the traces are typically extended to the outside edge of the IC substrate where they are connected to a plating bus, which is used only for plating. After the electroplating, the plating bus is removed before the electronic package is finished. For low density packages, it is relatively easy to incorporate the bus in the design of the IC substrate. For very dense designs, the metal traces on the IC substrate are spaced very close together. In some cases, it is not possible to route all the metal traces to the edge of the package for connection to the bus.

In the case where an independent conductive trace cannot be extended to the periphery of the circuit board to connect to the bus, the trace is temporally connected to another close trace by an additional conductive pattern so that an electrical current flows from a peripheral conductive pattern through the desired conductive segment. Such an additional conductive pattern, which is unnecessary in the final IC substrate configuration, is called a "plating lead pattern". The plating lead patterns are only necessary as an intermediate step in the plating step of the IC substrate. Once the plating is done, the traces must again be electrically isolated. Thus, the electrical interconnection between the independent conductive traces must be removed before the IC substrate is finished. The plating bus and plating lead patterns add complexity and cost to the manufacture of the IC substrate.

In view of the above, it is evident that what is needed is a low-cost method of electroplating select areas of a high density IC substrate without the need for a permanent plating bus or the addition of plating lead patterns.

SUMMARY OF THE INVENTION

The present invention addresses the above and other needs by providing a temporary plating bus for use in electroplating select areas of a high density integrated circuit substrate, eliminating the need for a permanent plating bus or plating lead patterns.

In one embodiment of the present invention, a temporary plating bus is attached to the top surface of a conventional integrated circuit substrate, covering the traces located thereon. The removable plating bus is made of a conductive material, such as copper foil. Vias are then formed through the substrate and the removable plating bus, exposing edges of the traces inside the vias. The vias are then plated in the conventional manner, preferably with copper. The traces are now in electrical contact with the removable plating bus (via the exposed edges and copper lined vias). Since each trace on the substrate is connected to a via, the removable plating bus is now electrically connected to all of the traces. This combined trace electrical connection is only temporary because when the removable plating bus is removed, the traces will once again be independent.

For electrical attachment of an integrated circuit (IC) chip to the traces (i.e., wire bonds, solder bumps), attachment lands must be plated on the traces. These lands are plated with nickel, gold or silver. To prevent unwanted areas of the IC substrate from being plated during the electroplating process, the IC substrate is covered with a plating resist. In the area where the lands are to be plated, portions of the removable plating bus are removed, exposing a portion of the trace that requires plating. Plating these exposed areas with nickel, silver, or preferably gold, is then done in the conventional electrolytic process using the removable plating bus as the electrical connection for the exposed traces to form the lands.

After the plating process is completed, the removable plating bus is peeled off the IC substrate, uncoupling the electrical connection among all of the traces. The gold plated lands of the traces can now be used for connection between the IC substrate and an integrated circuit chip. The lower surface of the IC substrate is then attached to an electronic package or printed circuit board.

BRIEF DESCRIPTION OF THE DRAWINGS

The above and other aspects, features and advantages of the present invention will be more apparent from the following more particular description thereof, presented in conjunction with the following drawings wherein.

Below is a list of reference numbers associated with the figures.

| No. | Component |
| --- | --- |
| 10 | Integrated Circuit Substrate |
| 15 | Traces |
| 20 | Removable Plating Bus |
| 25 | Metalized Top Surface |
| 30 | Adhesive Bottom Surface |
| 35 | Via |
| 40 | Copper Plated Via |
| 45 | Land or Exposed Portion of Trace |
| 50 | Gold Plated Land or Trace |
| 55 | Trace Edges |
| 60 | Solder Ball |
| 65 | Printed Circuit Board |
| 70 | Exposed Area |
| 100 | Integrated Circuit Chip or Flip-Chip |
| 105 | Wire Bond |
| 110 | Solder Bump |

DETAILED DESCRIPTION OF THE INVENTION

The following description is of the best mode presently contemplated for carrying out the invention. This description is not to be taken in a limiting sense, but is made merely for the purpose of describing the general principles of the invention. The scope of the invention should be determined with reference to the claims.

Figure 1:
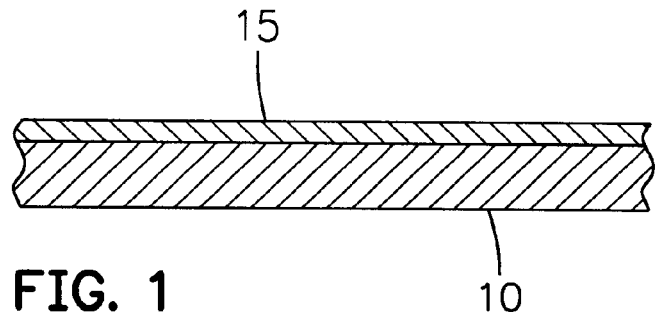
FIG. 1 is a cross-sectional view of an integrated circuit substrate with traces formed on the top surface.

FIG. 1 shows a cross-sectional view of an integrated circuit (IC) substrate 10, made in the conventional method that is known in the art. The IC substrate 10 is made from a nonconductive material such as a ceramic or plastic material, for example: Kapton, polyimide or PVC. Located on the top surface of the IC substrate 10 are a plurality of conductive traces 15. While the figures show the traces 15 on the top surface, it is understood that the traces may also be on the bottom surface. The traces 15 are made from conductive material such as copper, copper plated with gold or silver.

Figure 2:
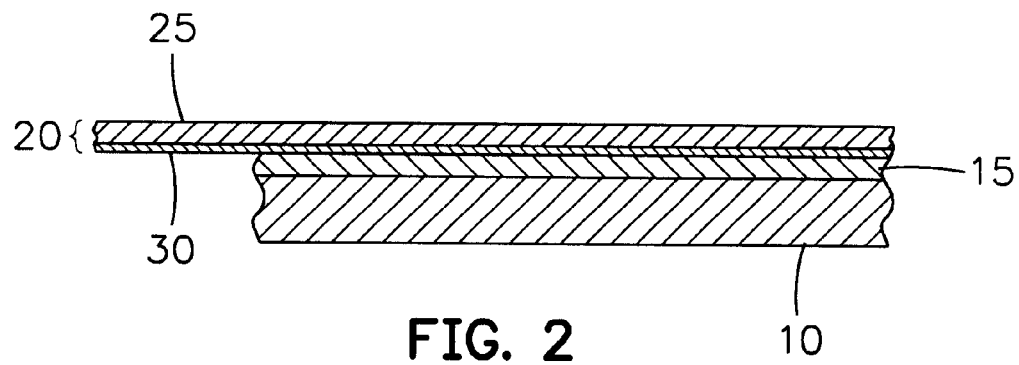
FIG. 2 is a cross-sectional view of the removable plating bus attached to the top surface of the substrate, covering the traces.

A removable plating bus 20 is attached to the top surface of the IC substrate 10, as shown in FIG. 2. The removable plating bus 20 is made of a conductive material and will be used to conductively connect all of the traces 15 together. In this case, the removable plating bus 20 is a metalized tape or foil 25, such as copper foil, with an adhesive backing 30 that is attached to the top surface of the IC substrate 10, covering the traces 15. The removable plating bus 20 is secured to the IC substrate 10 prior to forming any vias 35.

Figure 3:
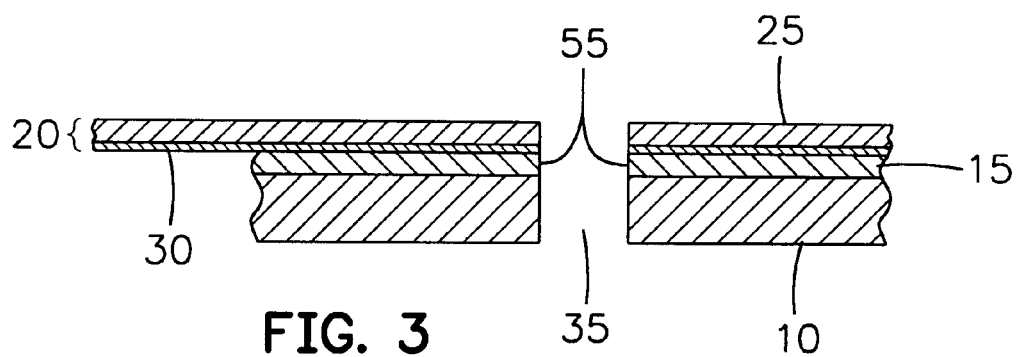
FIG. 3 is a cross-sectional view similar to FIG. 2 with a via.
Figure 4:
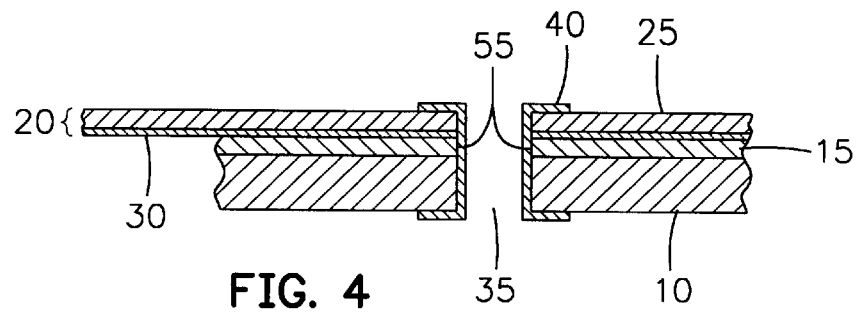
FIG. 4 is a cross-sectional view similar to FIG. 3 showing the via plated.

FIG. 3 shows the formation of a via 35 through the metalized tape 20, adhesive 30, trace 15 and IC substrate 10. As can be seen in the figures, when via 35 is formed, trace edges 55 of the trace 15 are exposed in the hole. This would also be the case if the traces were on the bottom surface or even a multilayered structure. Once the via 35 is formed and the trace edges 55 are exposed, the via 35 is then plated in the conventional manner with copper 40, as shown in FIG. 4. The copper via 40 makes electrical connectivity between the trace 15 (by way of the trace edge 55) and the metalized top surface 25 of the removable plating bus 20. Since each of the traces 15 on the substrate 10 is connected to a via 35, the metalized top surface 25 of the removable plating bus 20 is electrically connected to all of the traces 15. This combined trace electrical connection is only temporary because when the removable plating bus is removed, the traces are once again separated.

After the vias 35 are plated, the entire IC substrate 10, including the removable plating bus 20 is covered with a plating resist. The plating resist prevents unwanted areas of the IC substrate 10 from being plated during the electroplating process.

Figure 5:
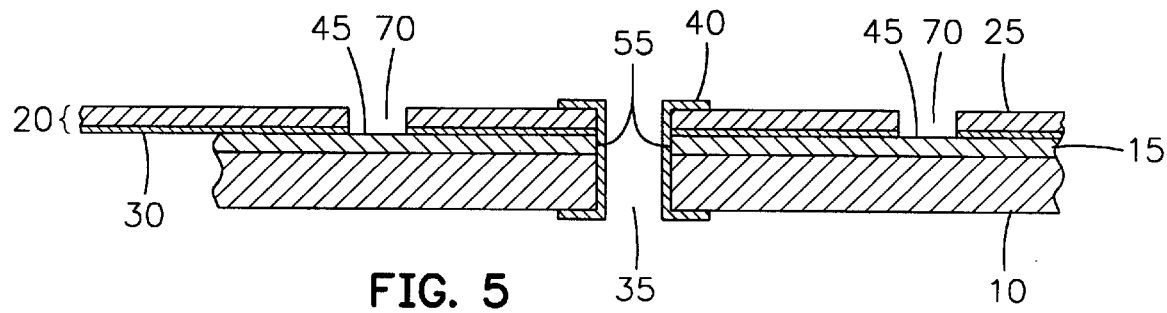
FIG. 5 is a cross-sectional view showing portions of the removable plating bus removed, exposing the areas of the traces to be electroplated for forming the lands.

For wire bonding or bump attachment of an IC chip or for attachment of solder balls or pins, lands are plated on the traces 15. These lands are plated with nickel, gold or silver. FIG. 5 shows an exposed area 70 where the removable plating bus 20 (i.e., the metalized tape or foil 25 and adhesive backing 30) have been removed, exposing a portion of the trace 15 that requires plating, shown as exposed traces 45. Additionally, when the removable plating bus 20 is removed, the plating resist for that area is also removed (because the plating resist was on the surface of the removable plating bus 20). Electroplating with nickel, silver or preferably gold, is then done in the conventional electrolytic process using the metalized tape or foil 25 of the removable plating bus 20 as the electrical connection for the exposed traces 45 on the IC substrate 10.

Figure 6:
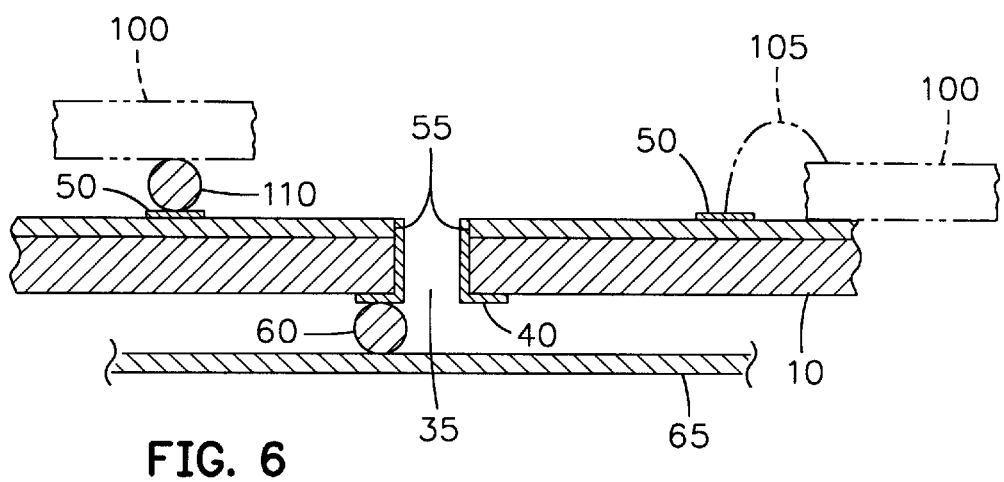
FIG. 6 is a cross-sectional view of the substrate with the removable plating bus removed showing the electroplated areas and attachment to an IC chip and printed circuit board.

After the plating process is completed, the removable plating bus 20 is peeled off the IC substrate 10, as shown in FIG. 6. The portions of the traces 15 that were originally covered by the removable plating bus 20 may now be coated with resist as needed. The gold plated lands 50 of the traces 15 can now be used for connection between the IC substrate 10 and an integrated circuit chip 100. One such electrical connection is a wire bond 105 electrically connecting the IC chip 100 to the gold plated lands 50. Alternately, the IC chip 100 may be a flip-chip that attaches to the gold plated lands 50 with a plurality of solder bumps 110. On the lower surface of the IC substrate 10 are a plurality of solder balls 60 for electrical attachment to an electronic package or printed circuit board 65.

Advantageously, use of the present invention eliminates the need for a plating bus on a dense IC substrate. The number and arrangement of the traces 15 and in the figures is meant to teach the present invention, but is not necessarily meant to show the actual number and arrangement of the traces that may be used in an IC package.

While the invention herein disclosed has been described by means of specific embodiments and applications thereof, numerous modifications and variations could be made thereto by those skilled in the art without departing from the scope of the invention set forth in the claims.

What is claimed is:

1. A method of electroplating an integrated circuit (IC) substrate with a removable plating bus, said method comprising:
   (a) releasably attaching the removable plating bus to a first surface of the IC substrate covering a plurality of conductive traces;
   (b) forming a plurality of vias through each one of the plurality of traces at preselected locations exposing edges of the selected trace in each corresponding via;
   (c) plating the vias with a conductive material thereby electrically connecting the removable plating bus, the plurality of traces and a second surface of the IC substrate;
   (d) coating the IC substrate and removable plating bus with plating resist;
   (e) selectively removing portions of the removable plating bus and plating resist exposing selected areas of the traces that require electroplating;
   (f) electroplating with conductive material the exposed trace areas; and
   (g) removing the removable plating bus.

2. The method of claim 1 wherein the removable plating bus comprises a metalized top surface and an IC substrate attachment means on the bottom surface.

3. The method of claim 2 wherein the metalized top surface is made from copper foil.

4. The method of claim 2 wherein the attachment means is an adhesive.

5. The method of claim 1 wherein the IC substrate is made from a nonconductive material.

6. The method of claim 5 wherein the nonconductive material is selected from the group consisting of ceramic, polyimide, polyvinyl chloride and Kapton.

7. The method of claim 1 wherein the forming of the vias comprises drilling.

8. The method of claim 1 wherein the conductive traces are formed of material selected from the group consisting of silver, copper and copper plated with gold.

9. The method of claim 1 wherein the conductive material for plating the vias is copper plating.

10. The method of claim 1 wherein the conductive electroplating material is selected from the group consisting of gold, silver and nickel.

11. A method of electroplating selected portions of conductive traces on an integrated circuit (IC) substrate using a removable plating bus, said method comprising:
    (a) providing an IC substrate having a first surface and a second surface;
    (b) forming a plurality of conductive traces on a first surface of the IC substrate;
    (c) providing a removable plating bus comprising a conductive copper foil top surface and an adhesive bottom surface;
    (d) attaching the bottom surface of the removable plating bus to the first surface of the IC substrate covering the plurality of conductive traces;
    (e) forming vias in predetermined locations through the removable plating bus and IC substrate exposing edges of the conductive traces;
    (f) plating the vias with copper thereby electrically connecting the removable plating bus, the exposed edges of the traces in the vias and the second surface of the IC substrate;
    (g) coating the IC substrate and removable plating bus with plating resist;
    (h) selectively removing portions of the removable plating bus and plating resist to expose selected areas of traces on the IC substrate that require plating;
    (i) electroplating with conductive material the exposed trace areas on the IC substrate using the removable plating bus as the electrical connection for the exposed metal traces to be plated; and
    (j) removing the metalized tape after plating.

12. The method of claim 11 wherein the IC substrate is made from a nonconductive material.

13. The method of claim 12 wherein the is nonconductive material selected from the group consisting of ceramic, polyimide, polyvinyl chloride and Kapton.

14. The method of claim 11 wherein the forming of the vias comprises drilling.

15. The method of claim 11 wherein the conductive electroplating material is selected from the group consisting of gold, silver and nickel.

16. The method of claim 11 further comprising the steps of:
    (k) attaching an integrated circuit (IC) die to the first surface of the substrate;
    (l) electrically connecting the IC die to the traces;
    (m) attaching the second surface of the substrate to a printed circuit board; and
    (n) electrically connecting the substrate to the printed circuit board.

* * * * *